(12) United States Patent
Weltin-Wu et al.

(10) Patent No.: US 7,940,099 B2
(45) Date of Patent: May 10, 2011

(54) METHOD OF IMPROVING NOISE CHARACTERISTICS OF AN ADPLL AND A RELATIVE ADPLL

(75) Inventors: Colin Weltin-Wu, New York, NY (US); Enrico Stefano Temporiti Milani, Pavia (IT); Daniele Baldi, Codevilla (IT)

(73) Assignee: STMicroelectronics S.R.L., Agrate, Brianza (IT)

( * ) Notice: Subject to any disclaimer, the term of this patent is extended or adjusted under 35 U.S.C. 154(b) by 0 days.

(21) Appl. No.: 12/630,585

(22) Filed: Dec. 3, 2009

(65) Prior Publication Data
US 2010/0141316 A1 Jun. 10, 2010

(30) Foreign Application Priority Data
Dec. 4, 2008 (IT) .............................. VA2008A0060

(51) Int. Cl.
*H03L 7/06* (2006.01)
(52) U.S. Cl. ......... 327/159; 327/150; 327/155; 375/376
(58) Field of Classification Search .................. 327/141, 327/144–163; 331/15–17; 375/373–376
See application file for complete search history.

(56) References Cited

U.S. PATENT DOCUMENTS

| | | | |
|---|---|---|---|
| 7,498,890 B2 * | 3/2009 | Wallberg et al. ................ 331/17 |
| 2006/0103566 A1 * | 5/2006 | Vemulapalli et al. ......... 341/155 |
| 2007/0188244 A1 * | 8/2007 | Waheed et al. ................ 331/16 |
| 2008/0063131 A1 * | 3/2008 | Furuta ........................... 375/376 |
| 2008/0297208 A1 | 12/2008 | Baudin et al. ................. 327/107 |
| 2008/0317187 A1 * | 12/2008 | Waheed et al. ............... 375/376 |
| 2009/0175399 A1 * | 7/2009 | Sun et al. ...................... 375/376 |
| 2010/0074387 A1 * | 3/2010 | Mendel et al. ................ 375/376 |

FOREIGN PATENT DOCUMENTS
EP 1956714 8/2008

OTHER PUBLICATIONS

Rylyakov et al., "A modular all-digital PLL architecture enabling both 1 to 2 GHz and 24-to-32 GHz operation in 65nm CMOS," 2008 IEEE International Solid-State Circuits Conference, Session 28, Non-volatile memory & digital clocking, 28.6, pp. 516-517.
Staszewski et al., "TDC-based frequency synthesizer for wireless applications," 2004 IEEE Radio Frequency Integrated Symposium, pp. 215-218.

(Continued)

*Primary Examiner* — Lincoln Donovan
*Assistant Examiner* — Brandon S Cole
(74) *Attorney, Agent, or Firm* — Lisa K. Jorgenson; Allen, Dyer, Doppelt, Milbrath & Gilchrist, P.A.

(57) ABSTRACT

An all-digital phase locked loop (ADPLL) generates a feedback word representing a continuous-time oscillating signal. The ADPLL includes a time-to-digital converter (TDC) configured to be input with the continuous-time oscillating signal and a reference signal. The reference signal is a function of a reference clock signal. The TDC is configured to generate a digital word, the feedback word being a function of the digital word. The ADPLL includes a delay circuit configured to be input with at least one of the reference clock signal and the continuous-time oscillating signal and to be controlled by a first dither signal.

14 Claims, 10 Drawing Sheets

OTHER PUBLICATIONS

Staszewski et al, "All-digital PLL and transmitter for mobile phones," IEEE Journal of Solid-State Circuits, vol. 40, No. 12, Dec. 2005, pp. 2469-2482.

Tonietto et al. "A 3MHz bandwidth low noise RF all digital PLL with 12ps reapproach time to digital converter," Proceedings of the ESSCIRC 2006, Sep. 18-22, 2006, pp. 150-153.

Weltin-Wu et al., "A 3GHz fractional-N all-digital PLL with precise time-to-digital converter calibration and mismatch correction," 2008 IEEE International Solid-State Circuits Conference, Session 19, PLLs & Oscillators, 19.3, pp. 344-345.

Isyllaios et al., "Time-domain modeling of an RF All-Digital PLL," IEEE Trans. Circuits Syst. II, Exp. Briefs, vol. 55, No. 6, pp. 601-605, Jun. 2008.

* cited by examiner

METHOD OF IMPROVING NOISE CHARACTERISTICS OF AN ADPLL AND A RELATIVE ADPLL

FIELD OF THE INVENTION

This invention relates to phase locked loops and, more particularly, to a method of improving noise characteristics of an all-digital phase locked loop and a relative all-digital phase locked loop.

BACKGROUND OF THE INVENTION

Typical analog fractional synthesizers are generally over-constrained in the design phase by shrinking processes, reduced supply voltage, and multi-standard integration. Essentially, digital phased locked loop (PLL) architectures, such as all-digital PLLs (ADPLLs), for example, as disclosed in [1-3], obviate to these limitations thanks to the intrinsically digital nature, with a digitally controlled oscillator (DCO) and a time-to-digital converter (TDC) as the sole analog blocks. As a result, ADPLLs offer wide programmability, easy technology scaling, and environmental robustness, while maintaining the same input-output behavior as analog PLLs. From a complexity standpoint, the "dividerless" architecture is most attractive because it mitigates the need for a critical multi-modulus divider by integrating the functions of Phase Frequency Detector—Charge Pump/dividers (PFD-CP/dividers) from a typical analog synthesizer into the TDC. An example, as disclosed in [5], of a dividerless architecture is depicted in FIG. 1. Another known, as disclosed in [6], dividerless architecture is depicted in FIG. 2.

In FIG. 1, Fref represents the reference clock, and Fout represents the ADPLL output signal. The frequency control word (FCW) defines the desired ratio between Fout and Fref. In FIG. 2, the TDC generates a digital word RDCO that represents the DCO output phase, and the word RR represents the reference phase.

Compared to a typical analog PLL, the divider, Phase Frequency Detector (PFD) and Charge Pump (CP) are all replaced by the TDC, which may provide a measurement of how the oscillator phase differs from the reference one. In particular, as shown in FIG. 1, the TDC computes the ratio between Fout and Fref, and an integrator INTEGRATOR converts the frequency error $\epsilon$ into a phase information, which corresponds to the phase difference between the output signal and the reference signal (except for a constant phase offset arising from integration). A low-pass digital filter DIGITAL LPF extracts the low-pass part of the output of the integrator, which is used to control the DCO.

In a practical application, however, the accuracy of such phase information is degraded by the finite reapproach of the TDC, which adds a quantization noise in the ADPLL loop.

The TDC depicted in FIG. 1 may comprise a simple clocked-resettable integer counter INTEGER COUNTER, characterized by a reapproach equal to a whole DCO period. Significantly better ADPLL performance can be achieved if a fractional counter FRACTIONAL COUNTER is used in conjunction with it, for improving the TDC reapproach while keeping the same dynamic range of the integer counter, as shown in FIG. 3. The digital output $C_F[n]$ of the fractional counter is derived by the block $1-z^{-1}$ and is added to the output $C_I[n]$ of the integer counter to generate the digital word Fout/Fref. The fractional counter is used to compute the residual time distance between two reference edges after integer counting, as illustrated in the time diagram of FIG. 4.

In this figure, the time interval Integer Count represents the result of integer counting operation ($C_I[n]$), i.e. the number of DCO periods (periods of the continuous-time oscillating signal Fout) between two reference edges. The time interval Fractional Count (indicated in gray) is the result of the fractional counter computation ($C_F[n]$), i.e. a measurement of the time distance between each reference edge and the last DCO edge. The residual time distance between two reference edges can be computed as $C_F[n]+(1-C_F[n-1])$, i.e. $1+(1-z^{-1})C_F[n]$, as shown in FIG. 3 (where the constant contribution is not highlighted).

To illustrate why the fractional counter is useful, let us first consider the degenerate case where only an integer counter is used (and thus $C_F[n]=0$). As an example, FIG. 5 depicts time graphs that show the synthesis of a fractional channel defined by FCW=120.2 starting from a 25 MHz reference, corresponding to a fractional frequency $F_{frac}=0.2*F_{ref}=5$ MHz.

As with a typical fractional PLL, when the ADPLL is locked, in correspondence with every reference edge, the distance between the last DCO (Fout) edge and the reference edge itself increases by 0.2*Tout. Tout is the period of the signal Fout due to non-integer frequency multiplication. Moreover, the average value of the integer counter may equal the FCW, such that the average value of $\epsilon[n]$ is zero.

Using an integer counter, in each group of 5 counts, as an average, only once the number 121 and four times the number 120 are attained (curve $C_I[n]$ in FIG. 5). This repeating sequence manifests itself periodically, so that a strong harmonic on $\epsilon[n]$ appears (curve (a)), the fundamental period of which is the fractional frequency Ffrac. By contrast, if a fractional counter with infinite precision were available, as in curves (b), $\epsilon[n]$ is identically 0, and thus, the TDC would add no quantization noise to the system.

In realistic cases, a fractional counter with temporal reapproach Tlsb is used, i.e. with K=Tout/Tlsb available quantization levels. As an example, let us consider the simple case with quantization levels of K=4. The corresponding $C_F[n]$ and $\epsilon[n]$ waveforms are reported in curves (c): the restriction to finite fractional counter reapproach has re-introduced harmonics in $\epsilon[n]$. In particular, the larger the number of quantization levels, i.e. the better the TDC reapproach, the lower the output spurious tone level. Since the fundamental period of this sequence is related to the fractional frequency, spurious tones in the output at multiples of this frequency should be expected.

The preceding analysis shows that even with perfectly-spaced quantization levels, a TDC-based ADPLL may have spurious tones at the output arising from quantization error. In addition, it shows that the waveform of the sampled phase difference from the fractional counter is a ramp with period equal to the period of Ffrac. If this periodic ramp enters in a non-linear region of the characteristics of the TDC transfer function, spurious tones may be enhanced in the ADPLL output.

The generation of in band spurious tones, as disclosed in [4], is clearly visible in FIG. 6, at frequencies of about $10^6$ Hz and $2 \cdot 10^6$ Hz. The amplitude of these tones is reduced by 30 dB in the reported figure compared to the real value, due to the use of a 1 kHz reapproach bandwidth for the measurement.

A potential drawback of these digital frequency synthesizers compared to the corresponding analog devices is that they suffer of relatively large in-band output spurious tones, which appear near the carrier at frequency offsets that are related to the periodicity in the TDC output pattern and are caused by the TDC finite reapproach. This phenomenon is further worsened by analog mismatches within the TDC.

SUMMARY OF THE INVENTION

A method of improving noise characteristics of an all-digital phase locked loop is disclosed. In-band spurious tones that corrupt the feedback word generated by an all-digital phase locked loop may be canceled by adding a dither signal to the digital word generated by the time-to-digital converter, the reference clock input to the TDC Fref, or the oscillating signal Fout input to the TDC. This may be effective whether the digital word represents the ratio between the reference clock Fref and the oscillating signal Fout or the DCO output phase.

This may be done, for example, by delaying the reference clock Fref or the oscillating signal Fout by a time determined in function of the level of the dither signal. According to an embodiment, this may be done by adding a dither signal to the digital word generated by the TVC. As an option, a second dither signal generated as an inverted and amplified replica of the first dither signal may be added to the digital word generated by the time-to-digital converter to compensate noise introduced by delaying the reference clock or the oscillating signal by a time determined in function of the level of the first dither signal.

According to an embodiment, variations of the digital word are measured in function of variations of the delay time in respect to a reference delay time and a look-up table is filled with the measured variations and the corresponding variations of the delay time. By generating the dither signal as a pseudo-random signal, in-band noise is minimized by adjusting the amplification gain to compensate for variations of the digital word due to variations of the delay time according to the values stored in the look-up table. A method of generating a digital feedback word of an ADPLL and a relative feedback circuit for an ADPLL and a relative ADPLL are also disclosed.

DETAILED DESCRIPTION OF THE PREFERRED EMBODIMENTS

Figure 1:
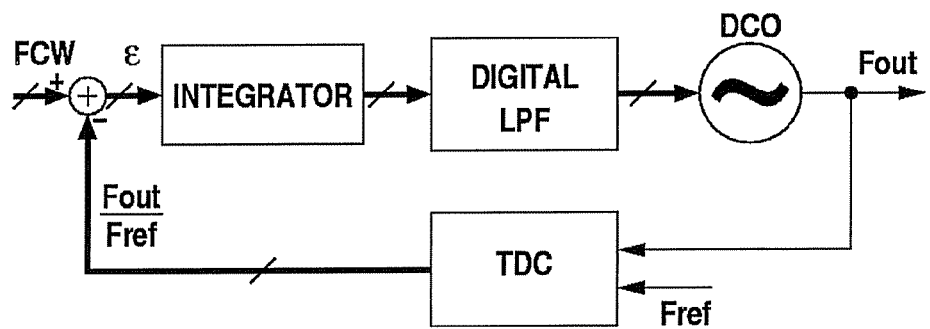
FIG. 1 is a schematic diagram of a high performance fractional ADPLL block diagram without a feedback divider, according to the prior art.
Figure 2:
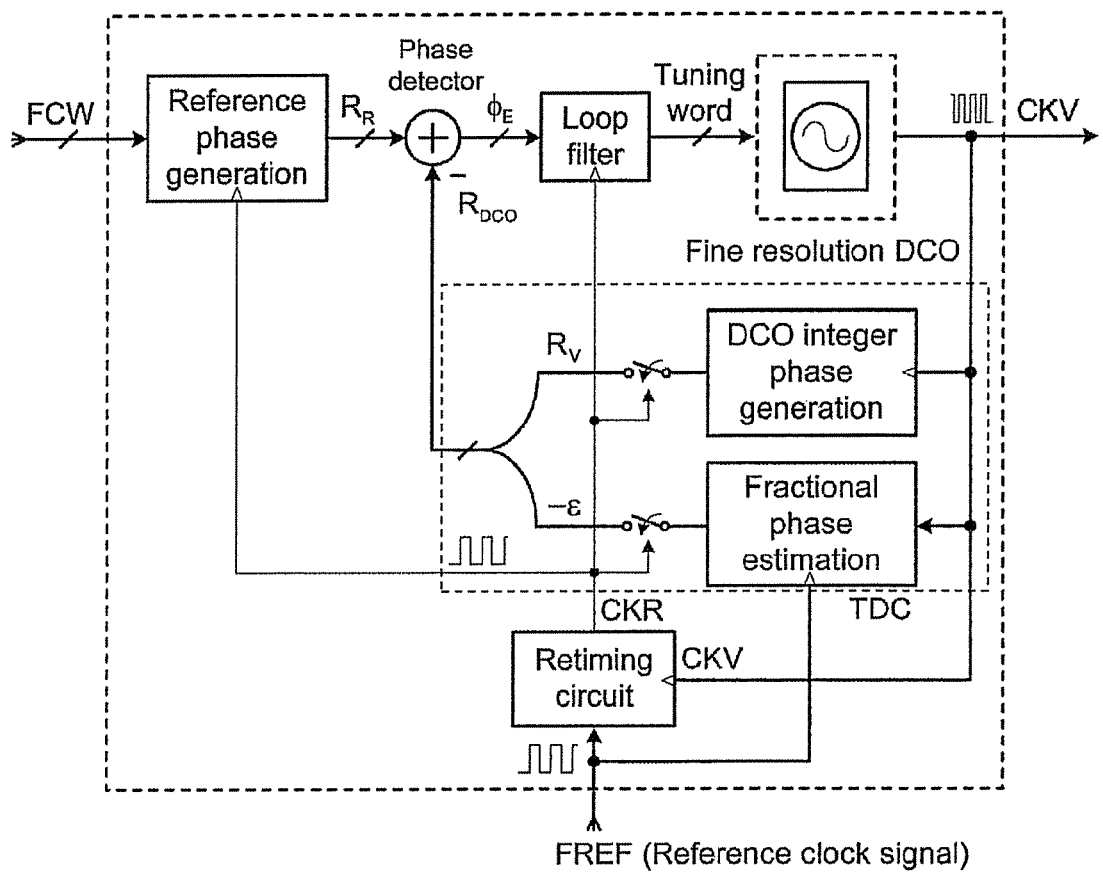
FIG. 2 is another schematic diagram of another example of a fractional ADPLL, according to the prior art.
Figure 3:
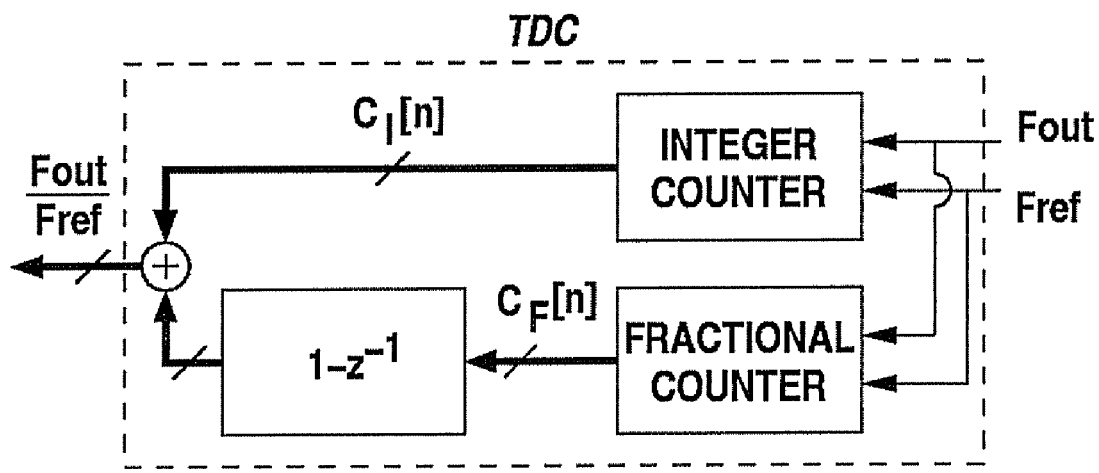
FIG. 3 is a schematic diagram of a complete TDC block diagram, according to the prior art.
Figure 4:
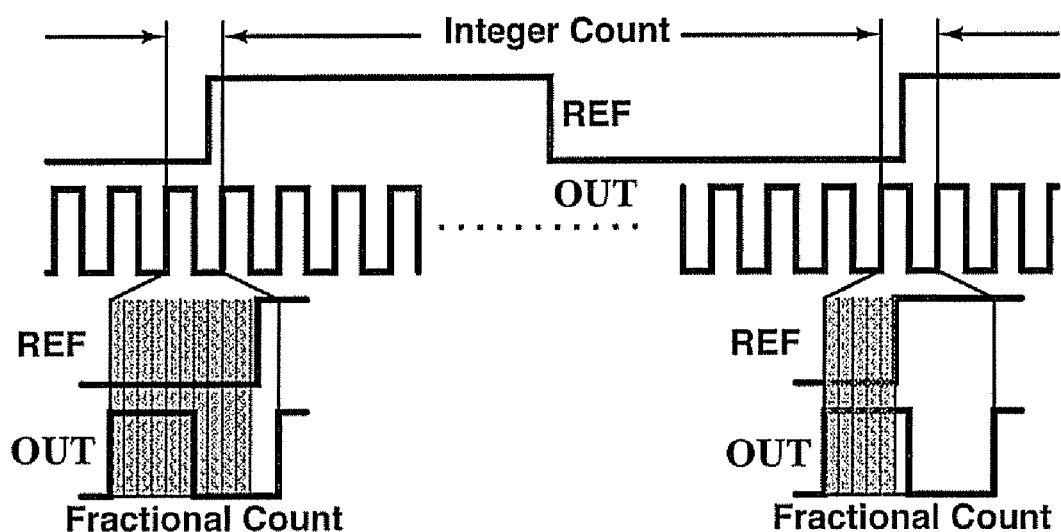
FIG. 4 is a timing diagram of the TDC counting operation (Fractional Count result is highlighted in gray), according to the prior art.
Figure 5:
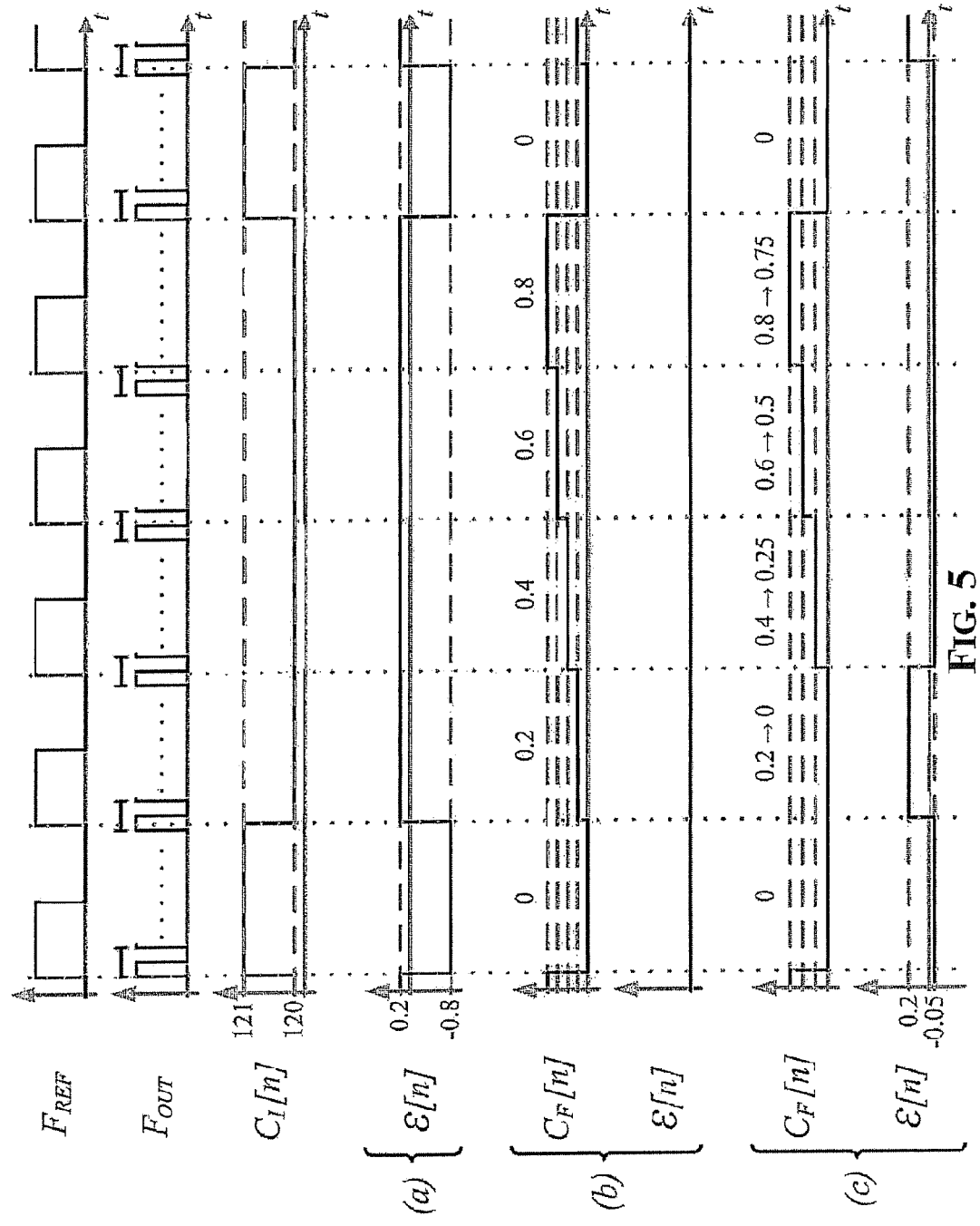
FIG. 5 is another timing diagram of a fractional ADPLL operation with FCW=120.2. (a) Integer counter alone; (b) Integer counter and infinite reapproach fractional counter; and (c) Integer counter and 4-level fractional counter, according to the prior art.

A first embodiment with an object to cancel the spurious tones introduced at the output due to the finite reapproach of the TDC (quantization) is depicted in FIG. 5. In this figure, the signal (a) is obtained with an integer counter alone, the signals (b) with an integer counter and an infinite reapproach fractional counter, and the signals (c) with an integer counter and a 4-level fractional counter. As may be observed, although the TDC has perfectly linear quantization steps, the finite reapproach causes the $\epsilon[n]$ signal to have periodic information, that produces spurious tones at the synthesizer output.

Figure 6:
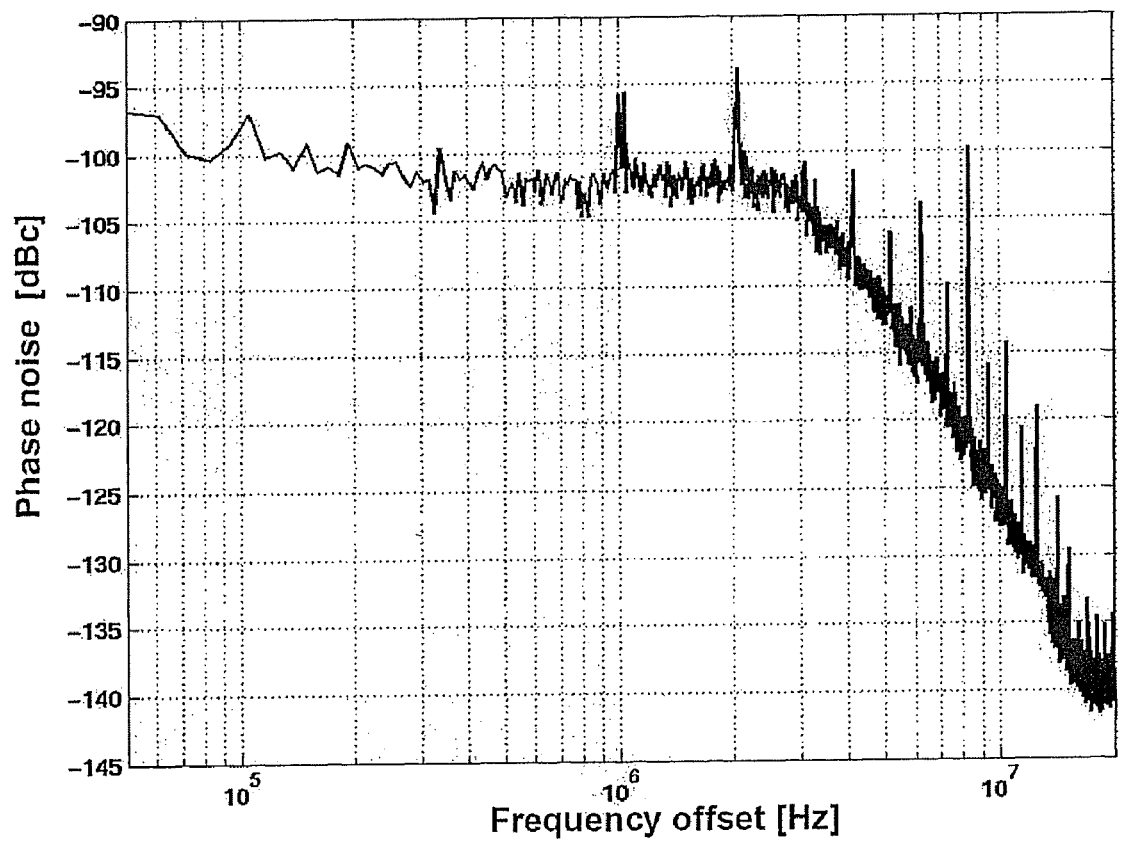
FIG. 6 a frequency spectrum diagram of an ADPLL disclosed in [4], according to the prior art.

To cancel these tones, according to a first embodiment, the output $C_F[n]$ is corrupted by a dither signal such that the quantization error becomes randomized. This can be achieved, for example, by injecting a dither signal with a small amplitude, for example, of about one quantization step of the TDC, either as a variable analog delay element immediately before the TDC on the reference path (FIG. 6) or on the DCO path (Fout in FIG. 6), or in a second embodiment (not depicted) as a digital signal added to the TDC output Fout/Fref.

Because the signal path from the injected dither signal to the ADPLL output is low-pass, a shaped dither signal is preferably used to avoid a negative impact to the in-band noise. More particularly, a dither signal whose energy increases with frequency is preferably used, such that the in-band contribution is negligible and the low-pass nature of the loop counteracts the higher noise power out of band. Independent of whether the spectral density of the dither signal is white or high-pass shaped, a multi-level dither is more effective than a two-level dither.

Figure 7:
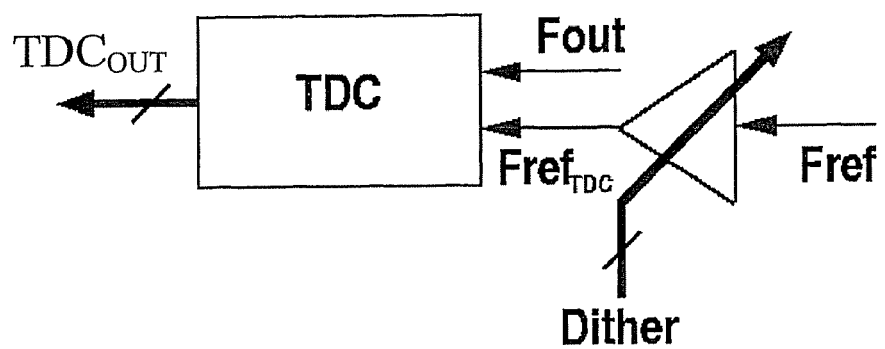
FIG. 7 is a schematic circuit diagram of $C_F[n]$ dither by insertion of an analog delay element before the TDC on the reference path, according to the present invention.

A multi-level dither can be done by using a programmable delay element (or any alternative means for phase programmability) with a fine delay granularity. Mismatches in the extra delay element itself do not negatively affect performances. The technique of this disclosure removes spurious tones due to temporal quantization inherent in the TDC, while requiring minimal hardware modifications to a TDC-based ADPLL. By placing a variable delay element before the TDC and providing a properly shaped dither signal, as shown in FIG. 7, minimal impact to in-band noise performance is achieved.

Figure 8:
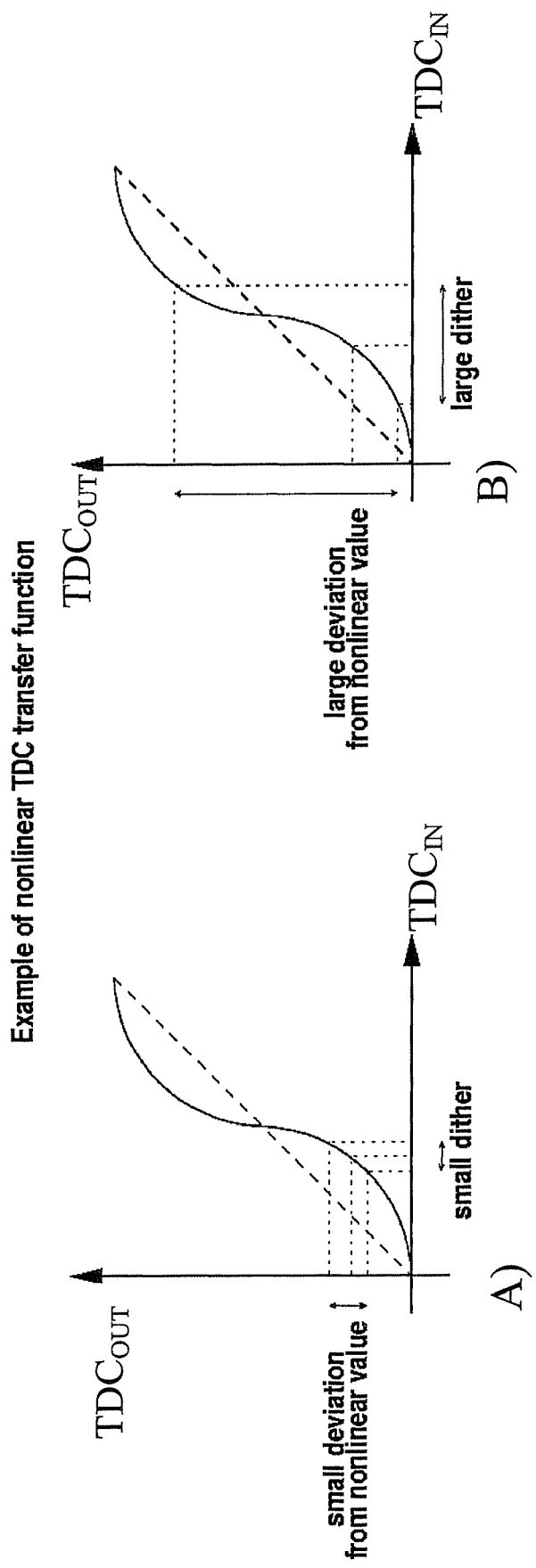
FIG. 8 is a diagram showing (a) small dither does not counteract TDC non-linearity; and (b) large dither forces a large deviation of the TDC output from the value affected by non linearity, according to the present invention.

An injected dither signal of relatively small amplitude is sufficient to break the periodicity of the quantization error signal on ϵ[n], however such a dither signal is insufficient to counteract the effects of TDC nonlinearity, which is another major cause of spurious tone increase in TDC based ADPLLs. In order to counteract TDC nonlinearity (as exemplified in FIG. 8), a dither signal of sufficient magnitude should be introduced. In doing so, a reduction of spurious tone power is traded for an increase of the in-band noise floor, which is no longer dominated by TDC output noise, as it was in the case of the previous embodiment.

In a hardware implementation of the algorithm, instead of a truly random dither signal, a pseudorandom dither signal generated by a Linear Feedback Shift Register (LFSR) of sufficient length with respect to the fractional periodicity is used. The technique of this disclosure increases the amplitude of the dither signal and uses a multi-level dither sequence and allows reduction of spurious tones due to non linearity of the TDC below the in-band noise floor, trading for an increase of the in-band noise power.

Figure 9:
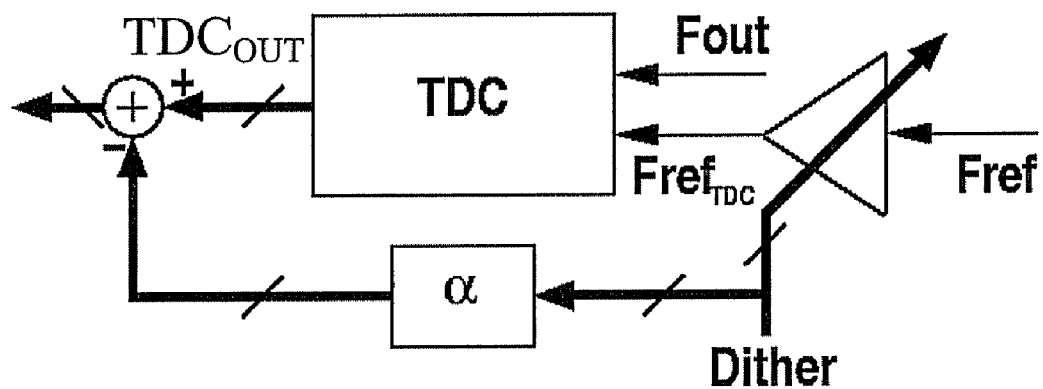
FIG. 9 is a schematic circuit diagram of compensation of the voluntarily injected dither, according to the present invention.

Another improvement includes compensating the undesired effect of the voluntarily injected dither, i.e. the effect of increasing the in-band noise floor. In fact, if the input dither is a pseudorandom sequence, it is always possible to predict the resulting injected phase error, and thus, to compensate it, as shown in FIG. 9. In this embodiment, it is possible to choose an arbitrary dither signal for effectively reducing the spurious tone increase due to TDC nonlinearities. The gain $\alpha$ relating the analog delays to the digital compensation signal is a high-reapproach word, and thus can be precisely controlled.

This is an additional advantage over an analog calibration approach, wherein the adjustable gain to be calibrated cannot be determined precisely because of analog mismatches. Even a rough estimation of the value of the gain $\alpha$ is enough to obtain significant compensation effectiveness.

Figure 10:
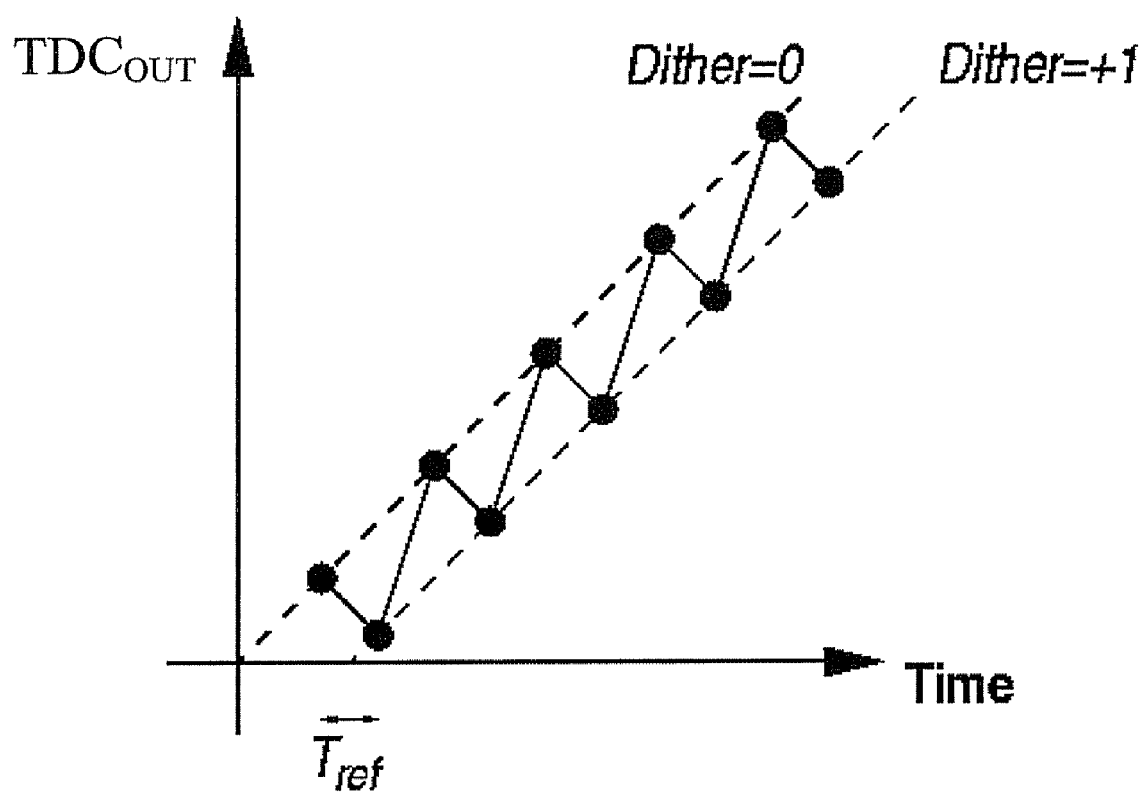
FIG. 10 is a diagram of initial estimation phase: single delay value alternated with the "reference delay" value for many samples to achieve a precise measurement of the difference in delay, according to the present invention.

According to another embodiment, digitally cancelling the introduced dither using a digital feed-forward path achieves the same reduction of spurious tones due to both quantization and non-linearity without penalizing significantly the in-band noise power. According to yet another embodiment, a technique for an accurate estimation of the gain $\alpha$ used for compensation is used to make the in-band noise floor equal to that of an undithered ADPLL. According to this method, during an initial digital estimation phase, a delay value of the additional variable delay element is chosen to be the "reference delay." Then, a different delay value to be calibrated against the "reference delay" is alternated for many samples with the "reference delay," as shown in FIG. 10, for the simplified case of a short periodicity channel with a large number of TDC quantization levels.

At the end of this sample collection phase, each sample is subtracted from the previous one for measuring the relative time difference between the delays in terms of TDC output values $TDC_{OUT}$. The absolute values of the results are averaged, obtaining an accurate measurement of the relative time difference between the delays for various TDC output values.

By taking a plurality of samples and choosing an appropriate channel for the calibration phase, it is possible to ensure that the full range of the TDC is swept, and thus, all nonlinearities are substantially averaged out. By computing the digital value corresponding to each analog delay level of the additional variable delay element instead of using a single constant $\alpha$ for various delay levels, a look-up table is filled in and is used for canceling effects of nonlinearities in the additional delay element itself. This method produces an accurate matching between the analog delay element and the digital feed-forward path.

This technique, based on a digital estimation potentially executed at the start-up of the disclosed ADPLL, relaxes analog precision requirements of the delay element of the embodiments disclosed hereinbefore. One embodiment of the proposed method is, in practice, a self-calibrating spurious tone reduction method for ADPLLs with no impact to the in-band noise floor.

Let us consider an exemplary test case of an ADPLL used to synthesize fractional channels around 3 GHz, starting from a 25 MHz reference frequency, with closed loop bandwidth of about 1 MHz, using a 25 bit FCW (7 bits for the integer part, 18 bits for the fractional part). A 42 level fractional TDC is used, i.e. with a reapproach of 333 ps/42=8 ps. As an example, a 3 kHz fractionality channel (FCW=120+$2^5/2^{18}$) is selected.

Figure 11:
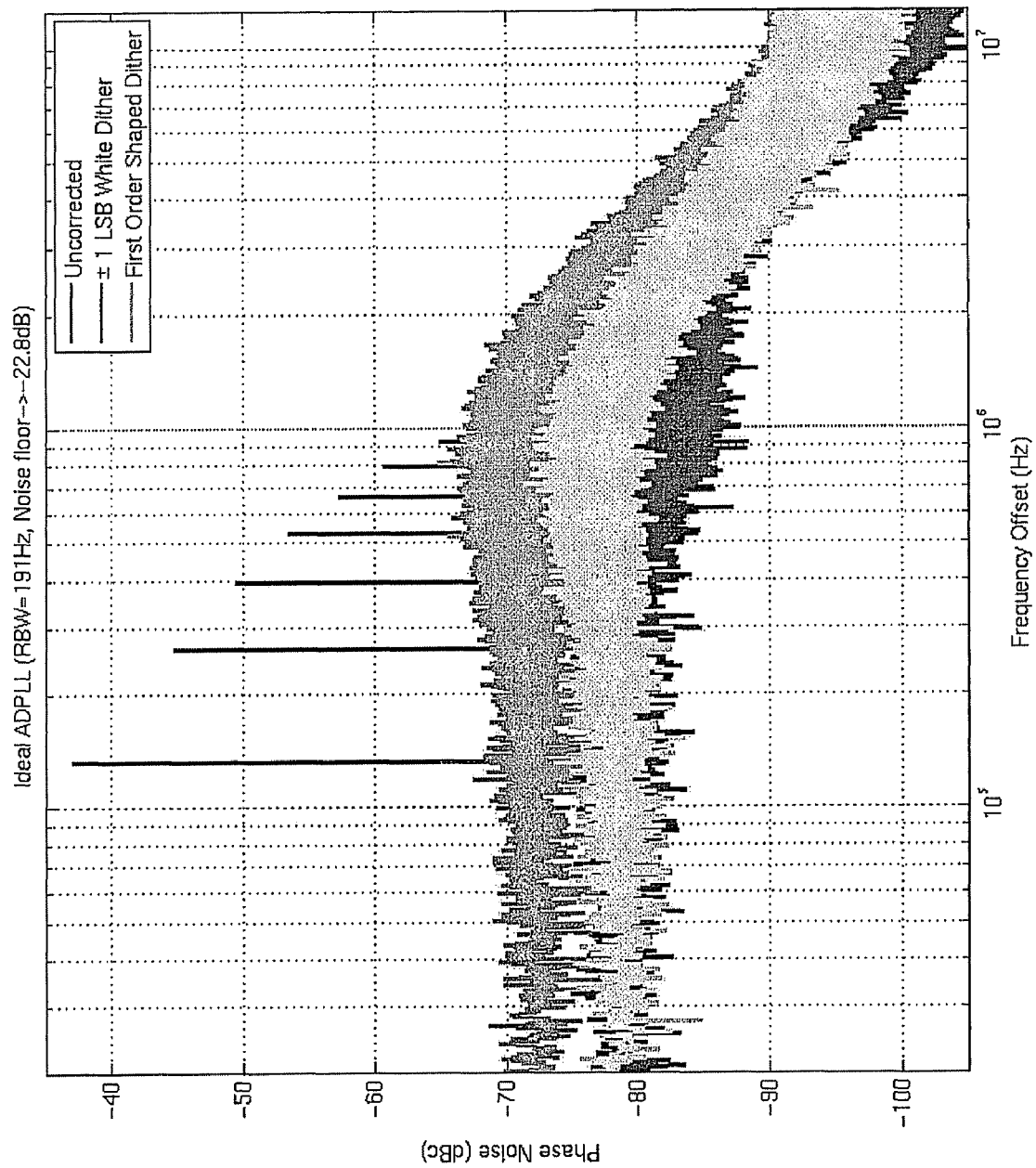
FIG. 11 is a frequency spectrum diagram of white versus shaped dither effect on an ideal ADPLL phase noise spectrum, according to the present invention.

To show the effectiveness of the first proposed embodiment (FIG. 6), let us consider the case of an ideal ADPLL. Only the TDC quantization effect is kept into account inside the ADPLL loop. The applied dither signal has a dynamic range equal to ±1 LSB of the fractional TDC (±8 ps) and a step of 1 ps (16 levels). The effect of white and $1^{st}$ order shaped dither on the ADPLL phase noise around the carrier is compared in FIG. 11.

Figure 12:
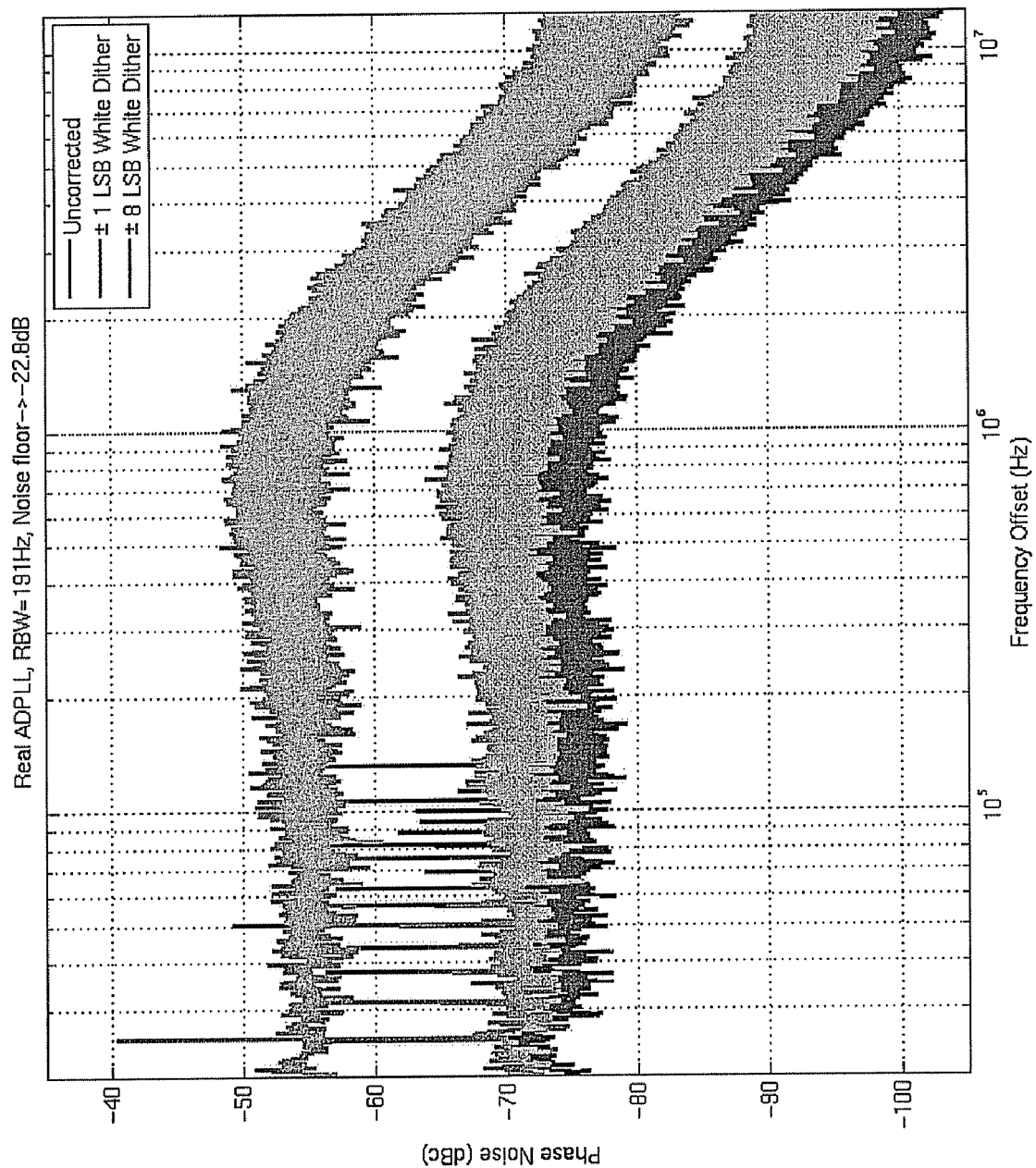
FIG. 12 is a frequency spectrum diagram of small versus large dither effect on a typical ADPLL phase noise spectrum, according to the present invention.

To show the effectiveness of the second proposed embodiment, consider the case of a real ADPLL. Also the TDC mismatch effect is kept into account inside the ADPLL model. A white dither is applied. The effects of a dither dynamic range equal to ±1 LSB of the fractional TDC (±8 ps) and of ±8 LSB of the fractional TDC (±64 ps), with a step of 1 ps (16 vs 64 levels), are compared in FIG. 12.

Figure 13:
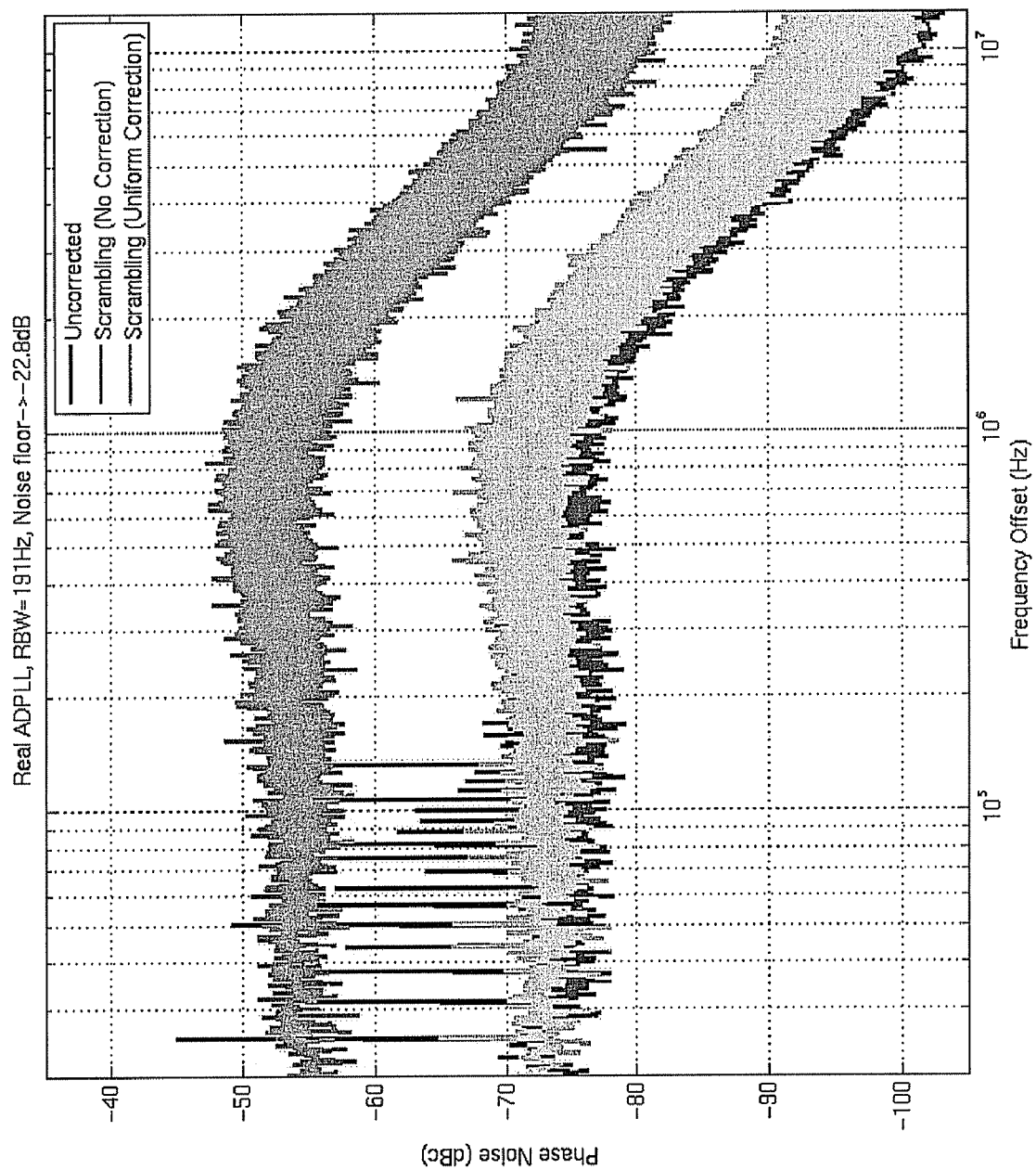
FIG. 13 is a frequency spectrum diagram of uniform compensation effect on a typical ADPLL phase noise spectrum, according to the present invention.

To show the effectiveness of the third proposed embodiment (FIG. 9), consider the case of a real ADPLL. Also the TDC mismatch effect is kept into account inside the ADPLL loop. A white dither is applied, with a dither dynamic range equal to ±8 LSB of the fractional TDC (±64 ps) and a nominal step of 8 ps (16 levels). Mismatches between the dither levels are kept into account. The effects of a compensation based on the nominal step value and without the compensation are compared in FIG. 13.

Figure 14:
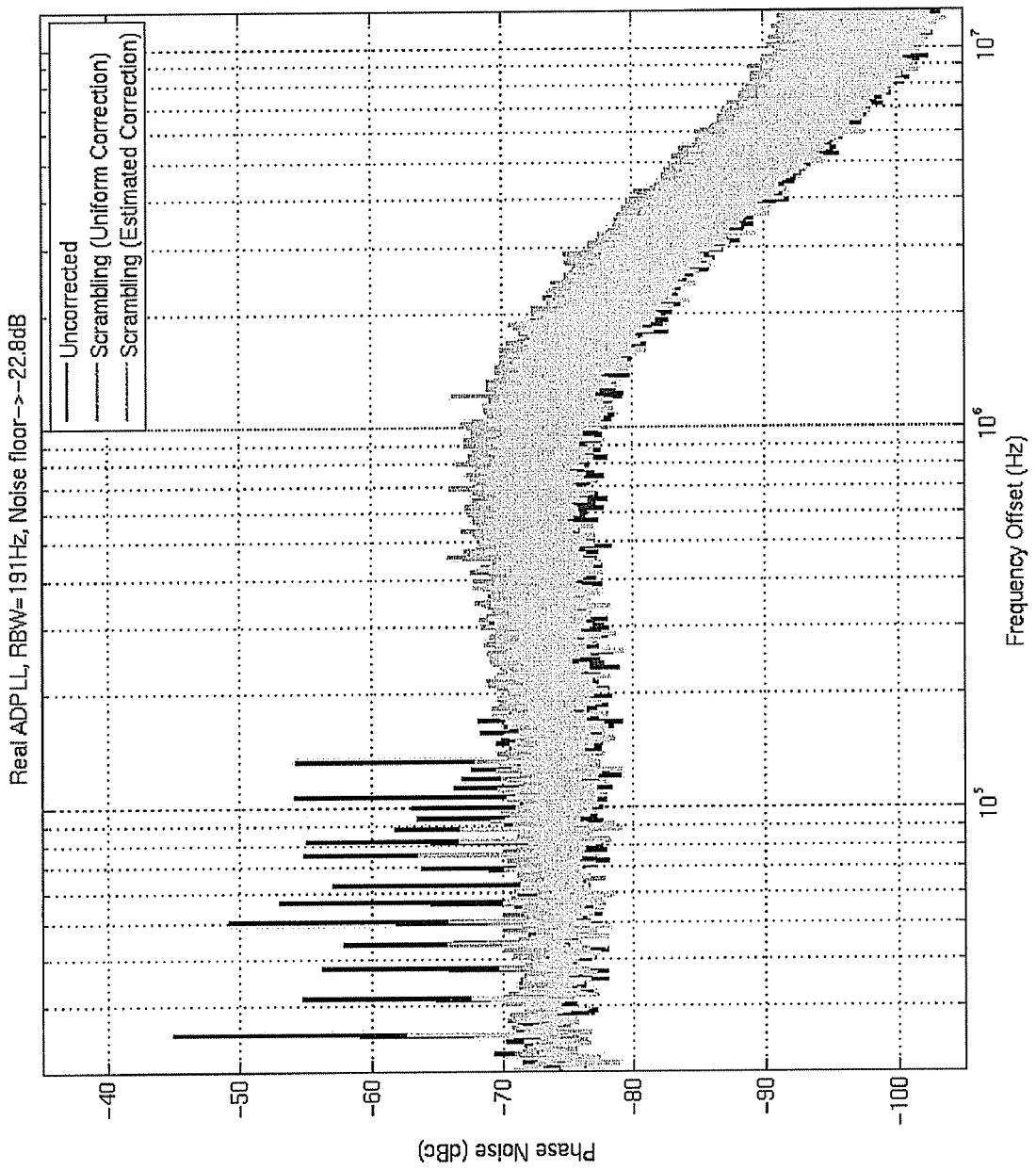
FIG. 14 is a frequency spectrum diagram of estimated compensation effect on a typical ADPLL phase noise spectrum, according to the present invention.

To show the effectiveness of another embodiment, consider the case of a real ADPLL. Also the TDC mismatch effect is kept into account inside the ADPLL loop. A white dither is applied, with a dither dynamic range equal to ±8 LSB of the fractional TDC (±64 ps) and a nominal step of 8 ps (16 levels). Mismatches between the dither levels are kept into account. The effects of a compensation based on the nominal step value and with the estimated value using the proposed digital estimation algorithm are compared in FIG. 14.

REFERENCES

[1] A. V. Rylyakov, J. A. Tierno, D. Z. Turker, J.-O. Plouchart, H. A. Ainspan, D. Friedman, "A modular all-digital PLL architecture enabling both 1 to 2 GHz and 24-to-32 GHz operation in 65 nm CMOS," 2008 IEEE International Solid-State Circuits Conference, Session 28, Non-volatile memory & digital clocking, 28.6, pages 516-517.

[2] R. B. Staszewski, D. Leipold, C.-M. Hung, P. T. Balsara, "TDC-based frequency synthesizer for wireless applications," 2004 IEEE Radio Frequency Integrated Symposium, pages 215-218.

[3] R. B. Staszewski, J. L. Wallberg, S. Rezeq, C.-M. Hung, O. E. Eliezer, S. K. Vemulapalli, C. Fernando, K. Maggio, R. Staszewski, N. Barton, M.-C. Lee, P. Cruise, M. Entezari, K. Muhammad, D. Leipold, "All-digital PLL and transmitter for mobile phones," IEEE Journal of Solid-State Circuits, Vol. 40, No. 12, December 2005, pages 2469-2482.

[4] R. Tonietto, E. Zuffetti, R. Castello, I. Bietti, "A 3 MHz bandwidth low noise RF all digital PLL with 12 ps reapproach time to digital converter," Proceedings of the ESS-CIRC 2006, Sep. 18-22, 2006, pages 150-153.

[5] C. Weltin-Wu, E. Temporiti, D. Baldi, F. Svelto, "A 3 GHz fractional-N all-digital PLL with precise time-to-digital converter calibration and mismatch correction," 2008 IEEE International Solid-State Circuits Conference, Session 19, PLLs & Oscillators, 19.3, pages 344-345.

[6] I. L. Syllaios, R. B. staszewski, P. T. Balsara, "Time-domain modeling of an RF All-Digital PLL," IEEE Trans. Circuits Syst. II, Exp. Briefs, vol. 55, no. 6, pp. 601-605, June 2008.

That which is claimed:

1. A method of reducing noise of an all-digital phase locked loop (ADPLL) generating a feedback word representing a continuous-time oscillating signal, the ADPLL including a time-to-digital converter (TDC) input with the continuous-time oscillating signal and a reference signal, the reference signal being a function of a reference clock signal, the TDC generating a digital word, the feedback word being based upon a function of the digital word, the method comprising:
   adding a pseudo-random sequence to at least one of the reference clock signal, the digital word, and the continuous-time oscillating signal;
   generating the reference signal by performing at least one of delaying the reference clock signal and delaying a replica of the continuous-time oscillating signal by a time value, the time value based upon a function of a level of the pseudo-random sequence; and
   generating the feedback word by adding the digital word to a dither signal, the dither signal being generated as an inverted and amplified replica of the pseudo-random sequence.

2. The method of claim 1 wherein the digital word represents at least one of a ratio between the continuous-time oscillating signal and the reference signal and mutual out-phasing of the continuous-time oscillating signal and the reference signal.

3. The method of claim 1 further comprising generating the feedback word by at least adding the pseudo-random sequence to the digital word.

4. The method of claim 1 wherein the pseudo-random sequence is a multi-level signal; wherein a spectrum of frequency amplitudes of the pseudo-random sequence is at a threshold in a set band; and wherein the spectrum of frequency amplitudes of the pseudo-random sequence increases beyond the threshold in frequencies outside of the set band.

5. The method of claim 1 further comprising:
   measuring variations of the digital word as a function of variations of the time value and filling a look-up table with the measured variations and the corresponding variations of the time value; and
   reducing noise by at least adjusting amplification gain of the pseudo-random sequence to compensate for variations of the digital word due to variations of the time value according to the values in the look-up table.

6. A device comprising:
   an all-digital phase locked loop generating a feedback word representing a continuous-time oscillating signal and comprising
   a time-to-digital converter (TDC) configured to be input with the continuous-time oscillating signal and a reference signal, the reference signal being a function of a reference clock signal,
   said TDC being configured to generate a digital word, the feedback word being a function of the digital word,
   a delay circuit configured to be input with at least one of the reference clock signal and the continuous-time oscillating signal and to be controlled by a first dither signal,
   an inverting amplifier input with the first dither signal and configured to generate a second dither signal as an amplified replica of the first dither signal, and
   an adder configured to generate the feedback word as a sum of the digital word with the second dither signal.

7. The device of claim 6 wherein the digital word represents at least one of a ratio between the continuous-time oscillating signal and the reference signal and mutual out-phasing of the continuous-time oscillating signal and the reference signal.

8. The device of claim 6 wherein said delay circuit is further configured to generate the reference signal as a replica of the reference clock signal delayed by a time based upon a level of the first dither signal.

9. The device of claim 6 wherein said delay circuit is further configured to input said TDC with a replica of the continuous-time oscillating signal delayed by a time based upon the level of the first dither signal, the reference signal being a replica of the reference clock signal.

10. An all-digital phase locked loop (ADPLL) generating a feedback word representing a continuous-time oscillating signal, the ADPLL comprising:
    a time-to-digital converter (TDC) configured to be input with the continuous-time oscillating signal and a reference signal, the reference signal being a function of a reference clock signal;
    said TDC being configured to generate a digital word, the feedback word being a function of the digital word;
    a delay circuit configured to be input with at least one of the reference clock signal and the continuous-time oscillating signal and to be controlled by a first dither signal; and
    an inverting amplifier input with the first dither signal and configured to generate a second dither signal as an amplified replica of the first dither signal.

11. The ADPLL of claim 10 wherein the digital word represents at least one of a ratio between the continuous-time oscillating signal and the reference signal and mutual out-phasing of the continuous-time oscillating signal and the reference signal.

12. The ADPLL of claim 10 wherein said delay circuit is further configured to generate the reference signal as a replica of the reference clock signal delayed by a time based upon a level of the first dither signal.

13. The ADPLL of claim 10 wherein said delay circuit is further configured to input said TDC with a replica of the continuous-time oscillating signal delayed by a time based upon the level of the first dither signal, the reference signal being a replica of the reference clock signal.

14. The ADPLL of claim 10 further comprising an adder configured to generate the feedback word as a sum of the digital word with the second dither signal.

* * * * *